(12) United States Patent
Sun et al.

(10) Patent No.: US 10,256,352 B2
(45) Date of Patent: Apr. 9, 2019

(54) STRUCTURES FOR NITRIDE VERTICAL TRANSISTORS

(71) Applicant: Massachusetts Institute of Technology, Cambridge, MA (US)

(72) Inventors: Min Sun, Cambridge, MA (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/388,963

(22) Filed: Dec. 22, 2016

(65) Prior Publication Data

US 2017/0236951 A1    Aug. 17, 2017

Related U.S. Application Data

(63) Continuation of application No. PCT/US2015/038169, filed on Jun. 26, 2015.

(Continued)

(51) Int. Cl.
| | |
|---|---|
| *H01L 29/15* | (2006.01) |
| *H01L 29/812* | (2006.01) |
| *H01L 29/78* | (2006.01) |
| *H01L 29/808* | (2006.01) |
| *H01L 29/06* | (2006.01) |

(Continued)

(52) U.S. Cl.
CPC ...... *H01L 29/8122* (2013.01); *H01L 21/0254* (2013.01); *H01L 29/0657* (2013.01); *H01L 29/0676* (2013.01); *H01L 29/2003* (2013.01); *H01L 29/66666* (2013.01); *H01L 29/7813* (2013.01); *H01L 29/7827* (2013.01); *H01L 29/8083* (2013.01); *H01L 29/0649* (2013.01)

(58) Field of Classification Search
CPC ............ H01L 21/0254; H01L 29/0657; H01L 29/0676; H01L 29/66666; H01L 29/7827; H01L 29/8122
USPC ........... 438/137, 138, 242; 257/76, 135, 302
See application file for complete search history.

(56) References Cited

U.S. PATENT DOCUMENTS 8,093,626 B2 * 1/2012 Niiyama ............ H01L 29/7835
  257/183
2008/0308838 A1 * 12/2008 McNutt ............... H01L 21/8232
  257/133

(Continued)

FOREIGN PATENT DOCUMENTS

JP    2011-129775 A    6/2011

OTHER PUBLICATIONS

International Search Report and Written Opinion for International Application No. PCT/US2015/038169 dated Sep. 23, 2015.
International Preliminary Report on Patentability for International Application No. PCT/US2015/038169 dated Jan. 5, 2017.

(Continued)

*Primary Examiner* — Long K Tran
(74) *Attorney, Agent, or Firm* — Wolf, Greenfield & Sacks, P.C.

(57) ABSTRACT

A vertical semiconductor transistor and a method of forming the same. A vertical semiconductor transistor has at least one semiconductor region, a source, and at least one gate region. The at least one semiconductor region includes a III-nitride semiconductor material. The source is formed over the at least one semiconductor region. The at least one gate region is formed around at least a portion of the at least one semiconductor region.

23 Claims, 8 Drawing Sheets

Related U.S. Application Data

(60) Provisional application No. 62/017,889, filed on Jun. 27, 2014.

(51) Int. Cl.
*H01L 29/20* (2006.01)
*H01L 21/02* (2006.01)
*H01L 29/66* (2006.01)

(56) References Cited

U.S. PATENT DOCUMENTS

| | | | |
|---|---|---|---|
| 2012/0286355 A1* | 11/2012 | Mauder | H01L 29/408 257/330 |
| 2013/0032811 A1* | 2/2013 | Kizilyalli | H01L 29/66924 257/76 |
| 2013/0043468 A1 | 2/2013 | Adekore | |
| 2013/0146885 A1 | 6/2013 | Brown et al. | |

OTHER PUBLICATIONS

Chowdhury et al., "Lateral and Vertical Transistors using the AlGaN/GaN Heterostructure", IEEE Transactions on Electron Devices, vol. 60, No. 10, Oct. 2013, pp. 3060-3066.

Mishra et al., "GaN-Based RF Power Devices and Amplifiers", Proceedings of the IEEE, vol. 96, No. 2, Feb. 2008, pp. 287-305.

Tolbert et al., "Power Electronics for Distributed Energy Systems and Transmission and Distribution Applications", Oak Ridge National Laboratory, ORNL/TM-2005/230, Dec. 2005, 75 pages.

Uesugi et al., "Which are the Future GaN Power Devices for Automotive Applications, Lateral Structures or Vertical Structures?", CS MANTECH Conference, May 16-19, 2011, 4 pages.

\* cited by examiner

STRUCTURES FOR NITRIDE VERTICAL TRANSISTORS

CROSS-REFERENCE TO RELATED APPLICATIONS

This application is a continuation of International Patent Application Serial No. PCT/US2015/038169, filed Jun. 26, 2015, which claims priority under 35 U.S.C. § 119(e) to U.S. Provisional Application Ser. No. 62/017,889, entitled "NEW STRUCTURES FOR GAN VERTICAL TRANSISTORS" filed on Jun. 27, 2014, each of which is hereby incorporated by reference in its entirety.

STATEMENT REGARDING FEDERALLY SPONSORED RESEARCH OR DEVELOPMENT

This invention was made with Government support under Grant No. DE-AR0000452 awarded by the Department of Energy. The Government has certain rights in the invention.

BACKGROUND

1. Field of Invention

The techniques described herein relate to vertical semiconductor devices, and in particular to vertical semiconductor transistors including a III-nitride semiconductor material.

2. Discussion of the Related Art

Improved power transistors are desired for advanced transportation systems, more robust energy delivery networks and new approaches to high-efficiency electricity generation and conversion. Applications of power transistors include power supplies, automotive electronics, automated factory equipment, motor controls, traction motor drives, high voltage direct current (HVDC) electronics, lamp ballasts, telecommunications circuits and display drives, for example. Such systems rely on efficient converters to step-up or step-down electric voltages, and use power transistors capable of blocking large voltages and/or carrying large currents. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of hybrid vehicles and other applications.

Nitride semiconductor devices have been proposed as offering the potential for producing high-efficiency power electronics demanding high blocking voltages and low on-resistances.

SUMMARY

Some embodiments relate to a vertical semiconductor transistor. The vertical semiconductor transistor has at least one semiconductor region, a source formed over the at least one semiconductor region, at least one gate region formed around at least a portion of the at least one semiconductor region, and a dielectric layer between the at least one semiconductor region and the at least one gate region. The at least one semiconductor region includes a III-nitride semiconductor material. The at least one gate region includes a metal.

In some embodiments, the at least one gate region is formed around the at least one semiconductor region to enclose a cross-sectional area of the at least one semiconductor region. In some embodiments, the at least one gate region and the at least one semiconductor region are coaxial.

In some embodiments, the at least one semiconductor region comprises a first semiconductor region formed over a second semiconductor region. The source is formed over the first semiconductor region, the second semiconductor region has a larger cross-sectional area than the first semiconductor region, and the at least one gate region is formed around the first semiconductor region. In some embodiments, the first semiconductor region has a higher dopant concentration than the second semiconductor region.

In some embodiments, the vertical semiconductor transistor further comprises a conductive layer formed on a surface of the at least one semiconductor region opposite to the source. In some embodiments, the at least one semiconductor region has a higher concentration of dopant proximate to the source than to the conductive layer. In some embodiments, the vertical semiconductor transistor further comprises a drain formed on a surface of the conductive layer opposite to the at least one semiconductor region. In some embodiments, the vertical semiconductor transistor of further comprises a drain formed on a surface of the conductive layer that contacts the at least one semiconductor region. The drain is positioned separate from the at least of semiconductor region. In some embodiments, the vertical semiconductor transistor further comprises a drain formed on a surface of the conductive layer. The drain includes a semiconductor region with a higher dopant concentration than the at least one semiconductor region.

In some embodiments, the source includes a semiconductor region having a higher dopant concentration than the at least one semiconductor region.

Some embodiments relate to a vertical semiconductor transistor having at least one semiconductor region, a source formed over the at least one semiconductor region, at least one gate region formed around at least a portion of the at least one semiconductor region, and an oxide layer between the at least one semiconductor region and the at least one gate region. The at least one semiconductor region includes a III-nitride semiconductor material. The at least one gate region includes a metal.

In some embodiments, the at least one gate region is formed around the at least one semiconductor region to enclose a cross-sectional area of the at least one semiconductor region. In some embodiments, the vertical semiconductor transistor further comprises a conductive layer formed on a surface of the at least one semiconductor region opposite to the source. In some embodiments, the vertical semiconductor transistor further comprises a drain formed on a surface of the conductive layer opposite to the at least one semiconductor region. In some embodiments, the at least one semiconductor region includes a first region proximate to the source and a second region having a cross-sectional area surrounded by the at least one gate region. The second region and the first region have different types of doping.

In some embodiments, the at least one semiconductor region includes a first n-type doped region proximate to the source, a second n-type doped region proximate to the conductive layer, and a p-type doped region between the first n-type doped region and the second n-type doped region. In some embodiments, the first n-type doped region has a higher dopant concentration than the second n-type doped region.

Some embodiments relate to a vertical semiconductor transistor having at least one semiconductor region, a source formed over the at least one semiconductor region, and at least one gate region formed around at least a portion of the at least one semiconductor region. The at least one semiconductor region includes a III-nitride semiconductor material. The at least one gate region includes a semiconductor doped with a p-type dopant.

In some embodiments, the vertical semiconductor transistor further comprises a conductive layer formed on a surface of the at least one semiconductor region opposite to the source. In some embodiments, the at least one semiconductor region has a higher concentration of dopant proximate to the source than to the conductive layer. In some embodiments, the at least one gate region includes a metal layer over a III-nitride semiconductor layer doped with a p-type dopant.

Some embodiments relate to a method of forming a vertical semiconductor transistor. The method includes forming at least one semiconductor region, forming a source over the at least one semiconductor region, forming at least one gate region around at least a portion of the at least one semiconductor region, and forming a dielectric layer between the at least one semiconductor region and the at least one gate region. The at least one semiconductor region includes a III-nitride semiconductor material. The at least one gate region includes a metal.

In some embodiments, forming the at least one semiconductor region comprises forming a first semiconductor region over a second semiconductor region. The source is formed over the first semiconductor region, the second semiconductor region has a larger cross-sectional area than the first semiconductor region, and forming the at least one gate comprises forming the at least one gate around the first semiconductor region. In some embodiments, forming the first semiconductor region over the second semiconductor region comprises forming the first semiconductor region with a higher dopant concentration than the second semiconductor region.

Some embodiments relate to a method of forming a vertical semiconductor transistor. The method includes forming at least one semiconductor region, forming a source over the at least one semiconductor region, forming at least one gate region around at least a portion of the at least one semiconductor region, forming an oxide layer between the at least one semiconductor region and the at least one gate region. The at least one semiconductor region includes a III-nitride semiconductor material. The at least one gate region includes a metal.

In some embodiments, forming at least one semiconductor region comprises forming a first n-type doped region proximate to the source, a second n-type doped region proximate to the conductive layer, and a p-type doped region between the first n-type doped region and the second n-type doped region.

Some embodiments relate to a method of forming a vertical semiconductor transistor. The method includes forming at least one semiconductor region, forming a source over the at least one semiconductor region, and forming at least one gate region around at least a portion of the at least one semiconductor region. The at least one semiconductor region includes a III-nitride semiconductor material. The at least one gate region includes a III-nitride semiconductor doped with a p-type dopant. In some embodiments, the at least one semiconductor region doped with a n-type dopant.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques described herein.

DETAILED DESCRIPTION

Figure 1A:
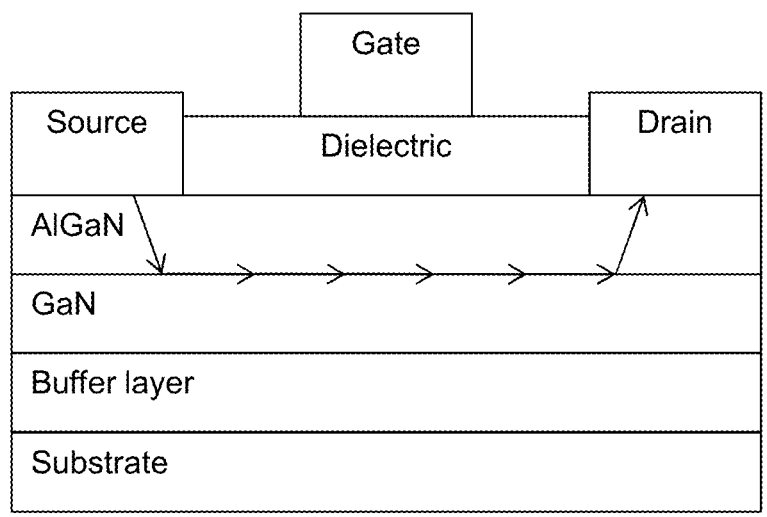
FIG. 1A shows a lateral high electron mobility transistor (HEMT) AlGaN/GaN structure and illustrates electron flow through the lateral HEMT.

Both vertical and lateral structures have been considered for GaN transistor devices. Lateral transistor architectures, such as AlGaN/GaN high electron mobility transistors (HEMTs) shown in FIG. 1A, though they have been studied extensively, still face challenges for high voltage applications and thermal management. Since most of the voltage drop between the drain and gate contacts occurs in the drain access region and the electric field in that region should be below a critical electric field when operating the transistor, a transistor suitable for high voltage applications may have a larger lateral spacing for a reduced effective current density. Additionally, the current in a lateral device is confined to flow within a relatively thin portion of the device, such as the region between the AlGaN and GaN layers of the HEMT shown in FIG. 1A. The interface between the AlGaN and GaN layers may form a two dimensional electron gas (2DEG) which allows current flow. Current confined to flow within a limited volume of material, such as the 2DEG within a planar region at the interface between AlGaN and GaN layers, induces large amounts of heating at the interface.

Figure 1B:
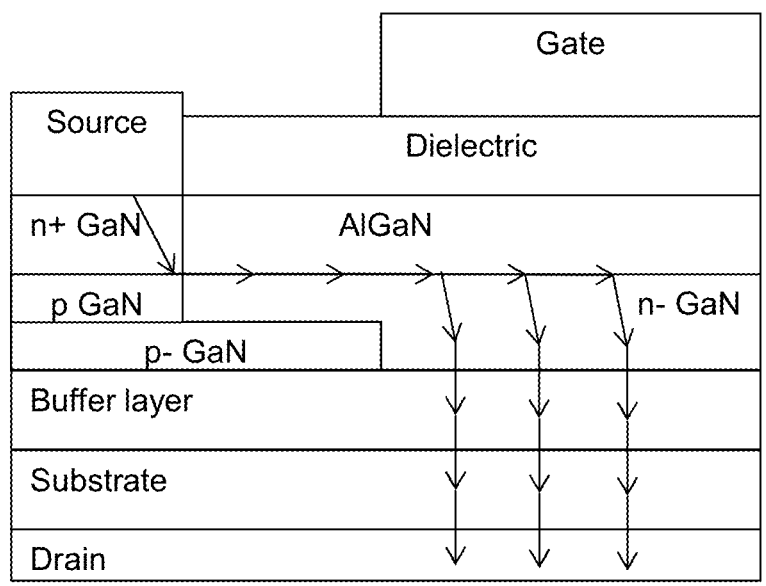
FIG. 1B shows a current aperture vertical electron transistor (CAVET) having a pseudo-vertical structure and illustrates electron flow through the CAVET.

Vertical transistors may overcome being limited by thermal dissipation because their structure allows for current to flow through a larger volume of material than in lateral transistors, which provides a greater degree of thermal management. By having the voltage across the gate and drain in the vertical direction, vertical transistors may occupy a smaller area than lateral transistors. As shown in FIG. 1B, a current aperture vertical electron transistor (CAVET) has contacts along the vertical direction of the device with the gate on the top and the drain on the bottom. Similar to the lateral transistor shown in FIG. 1A, electrons travel laterally in between the AlGaN and n− GaN layers towards a region underneath the gate which controls the electron flow to the drain. Such a vertical transistor structure includes a current blocking layer, such as the p− GaN layer in the CAVET shown in FIG. 1B, which when subjected to high electric field prevents electrons not controlled by the gate from contributing to the current by directing electrons towards a region underneath the gate before they travel to the drain. Although this type of vertical structure may achieve higher effective current densities and improved thermal management, there are fabrication challenges and costs because of the complexity of the structure. To be an effective current blocking layer, the p− GaN is grown without substantial dislocations and defects which, if present, would allow leakage current. Fabrication of a p− GaN layer to act as a suitable current blocking layer and n− GaN in one layer is challenging and expensive partially because of including a step in the fabrication process to regrow n− GaN.

As should be appreciated from the above discussion, producing vertical III-N semiconductor transistors can improve effective current density and thermal management in addition to reducing the area of the device. Vertical transistor structures designed to reduce costs and complexity associated with fabrication may allow for widespread use of III-N semiconductor transistors. A vertical transistor architecture where electrons flows through a vertical channel having more volume than in a conventional lateral transistor may reduce confinement of current flow and improve operation characteristics including effective current density and thermal management. The channel may have a nano-wire structure or nano-ribbon structure, rather than a planar region defined by a 2DEG at the interface between AlGaN and GaN layers. A gate designed to control the electron flow through the vertical channel may laterally surround, at least partially, the vertical channel such that depletion of the conducting channel occurs laterally. Described herein are transistor structures and fabrication methods that can achieve vertical III-N semiconductor transistors having a vertical channel and one or more gate regions positioned around the vertical channel. In some embodiments, one or more gate regions may completely surround a circumference of the vertical channel such that every point within the channel is within a certain distance from the gate. The methods and techniques described herein can be applied to any of a variety of compound semiconductor transistors to enable the fabrication of a vertical transistor having a vertical channel and a gate formed to surround, at least partially, a vertical channel region. Embodiments of vertical transistors and fabrication methods for forming such transistors are described herein.

Figure 2A:
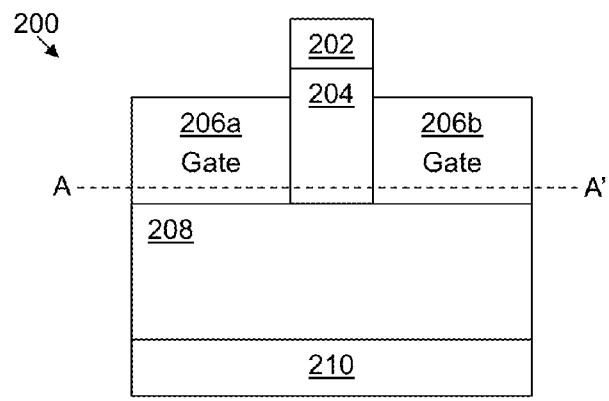
FIG. 2A shows a cross-sectional view of a vertical transistor having a fully-vertical geometry.
Figure 2B:
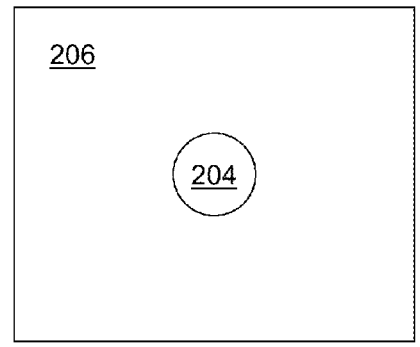
FIG. 2B shows an exemplary planar view of the fully-vertical transistor of FIG. 2A along line A-A'.
Figure 2C:
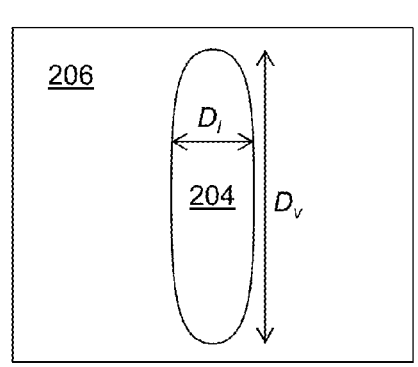
FIG. 2C shows another exemplary planar view of the fully-vertical transistor of FIG. 2A along line A-A'.

Different vertical transistor structures may vary depending on respective locations of the source and the drain while include a channel that is at least partially surrounded by a gate. FIG. 2A shows a cross-sectional diagram illustrating a III-nitride vertical transistor 200 according to some embodiments. The vertical transistor includes drain 210, a drift region 208 formed over drain 210, channel region 204 and gate regions 206a and 206b formed over the drift region 208, and a source 202 formed over the channel region 204. In some embodiments, the channel and surrounding gate regions may share a common axis and be substantially coaxial such that the gate regions are uniformly distributed around the channel. Gate regions 206a and 206b are positioned around channel 204 and may connect to form a continuous gate region as shown in FIG. 2B, which illustrates a planar view of vertical transistor 200 along line A-A', where gate 206 completely surrounds channel 204. Although channel 204 is shown to have a circular cross-sectional geometry in FIG. 2B, channel 204 may have any suitable cross-sectional shape and dimension, and other geometries and configurations of the channel and surrounding gate may be implemented including elliptical, rectangular, square, and triangular cross-sectional shapes. FIG. 2C illustrates an alternative planar view of vertical transistor 200 along line A-A', where channel 204 has an elliptical shape and is surrounded by gate 206. The channel may have a cross-sectional dimension, such as a diameter for the circular cross-sectional area shown in FIG. 2B or dimension $D_l$ or $D_v$ for the cross-sectional area shown in FIG. 2C, of less than 1 micron, less than 750 nanometers, less than 500 nanometers, less than 250 nm, less than 100 nm, less than 50 nm, or less than 20 nm.

Figure 2D:
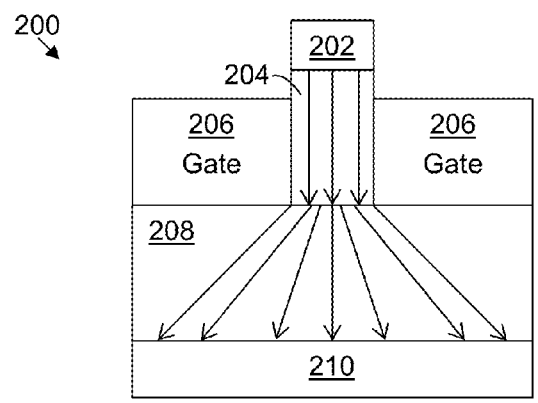
FIG. 2D illustrates electron flow in the fully-vertical transistor of FIG. 2A.

Since source 202 is positioned over drain 210, this transistor structure may be considered a "fully-vertical" structure. Electrons flow between the source 202 and the drain 210 through the channel region 204 and drift region 208 along the vertical direction, as shown by arrows in FIG. 2D, illustrating electron flow through transistor 200. While electrons are constrained within channel region 204, the drift region 208 allows the electrons to spread laterally which aids in heat dissipation by causing the electrons to pass through a larger volume of material. The drain 210 collects the electrons by having dimensions that occupy the lateral spread of the electrons within the drift region 208.

Figure 2E:
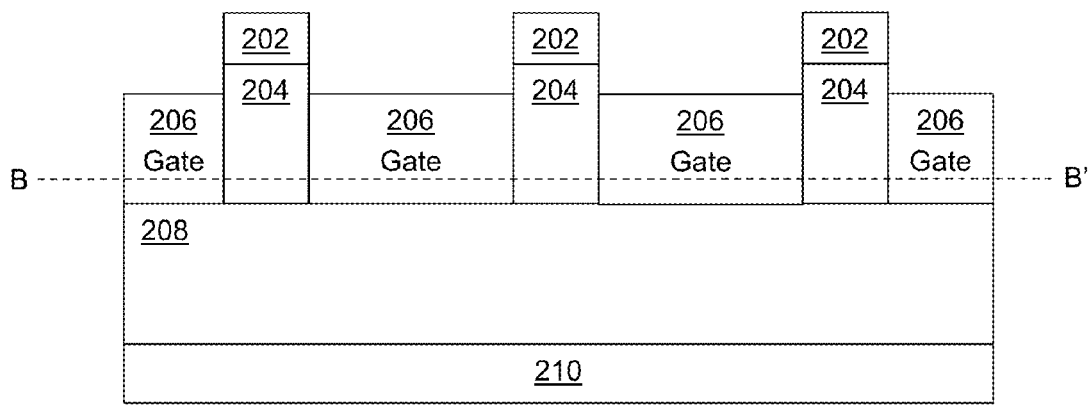
FIG. 2E shows a cross-sectional view of a vertical transistor having multiple channel regions.
Figure 2F:
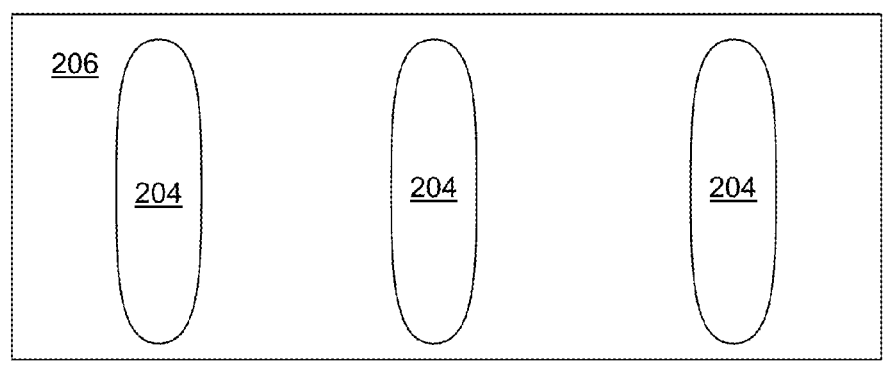
FIG. 2F shows a planar view of the vertical transistor of FIG. 2E along line B-B'.

Some embodiments may relate to configurations of vertical transistors having a channel with one or more regions of material where the gate surrounds at least a portion of the one or more channel regions. Any suitable number of channel regions may be included in a vertical transistor. FIG. 2E illustrates a vertical transistor having multiple channel regions with gate regions 206 between the channel regions 204. Some embodiments may include multiple source regions 202, such as shown in FIG. 2E, which contact the channel regions 204. Additionally or alternatively, a source region may be formed to contact more than one channel region. A drift region 208 is formed between the channel regions 204 and the drain 210. The gate may be a continuous region, such as gate 206 shown in FIG. 2F which illustrates a planar view of the transistor of FIG. 2E along line B-B'. Other embodiments of a vertical transistor may include more than one gate region that act to control electron flow within the multiple channel regions.

Figure 3A:
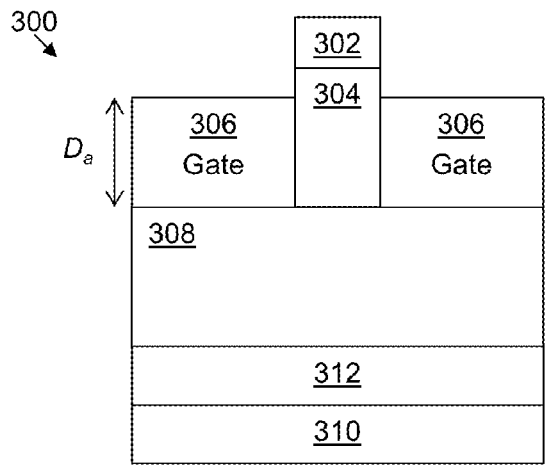
FIG. 3A shows a cross-sectional view of another exemplary vertical transistor having a fully-vertical geometry.
Figure 3B:
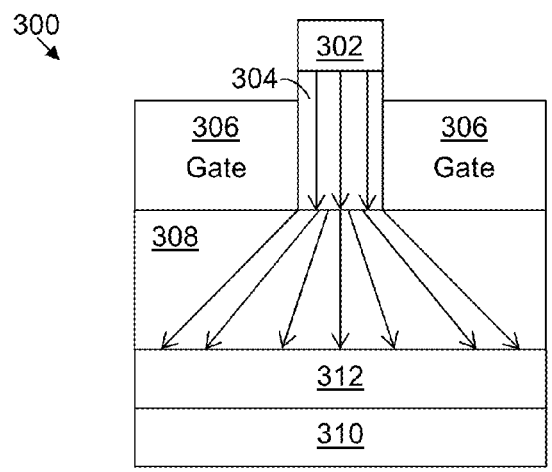
FIG. 3B illustrates electron flow in the fully-vertical transistor of FIG. 3A.

Additional components and layers may be included in a vertical transistor. As shown in FIG. 3A, a fully-vertical transistor structure may also include a conductive layer 312 positioned between the drift region 308 and the drain 310. Electron flow controlled by gate 306 flows from source 302 through channel 304 and drift region 308, as shown by arrows indicating electron flow within transistor 300 in FIG. 3B. Conductive layer 312 may act to improve collection of electrons by drain 310.

Figure 3C:
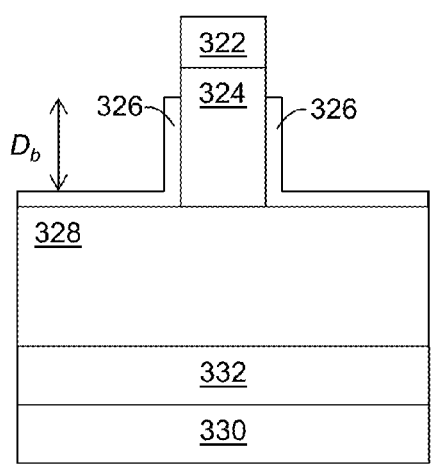
FIG. 3C shows a cross-sectional view of another exemplary vertical transistor having a fully-vertical geometry.

In some embodiments, the gate may include a layer of conductive material (e.g., metal) formed over the channel and drift region such as by depositing a certain thickness of the conductive material. FIG. 3C illustrates an exemplary vertical transistor having gate 326 as a layer of material over channel 324 and drift region 328. The gate layer 326 may completely surround the channel 324.

Gate regions and/or gate layers of a vertical transistor may be sized and shaped to have any suitable dimension configured to control electron flow through the channel of the vertical transistor. A vertical dimension of the gate region, such as $D_a$ in FIG. 3A, or gate layer, such as $D_b$, in FIG. 3C, may correspond to a vertical dimension of the channel to provide suitable control for electron flow through the channel. For example, the vertical dimension for the gate may approximate a vertical length of the channel. In some embodiments, the vertical dimension may be less than 500 nm, less than 400 nm, less than 300 nm, or less than 200 nm.

Figure 4A:
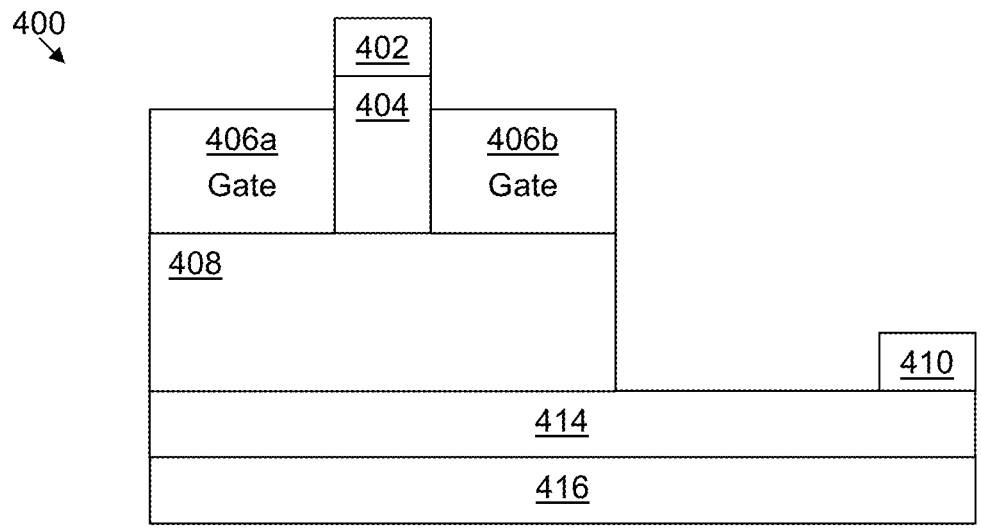
FIG. 4A shows a cross-sectional view of a vertical transistor having a pseudo-vertical geometry.
Figure 4B:
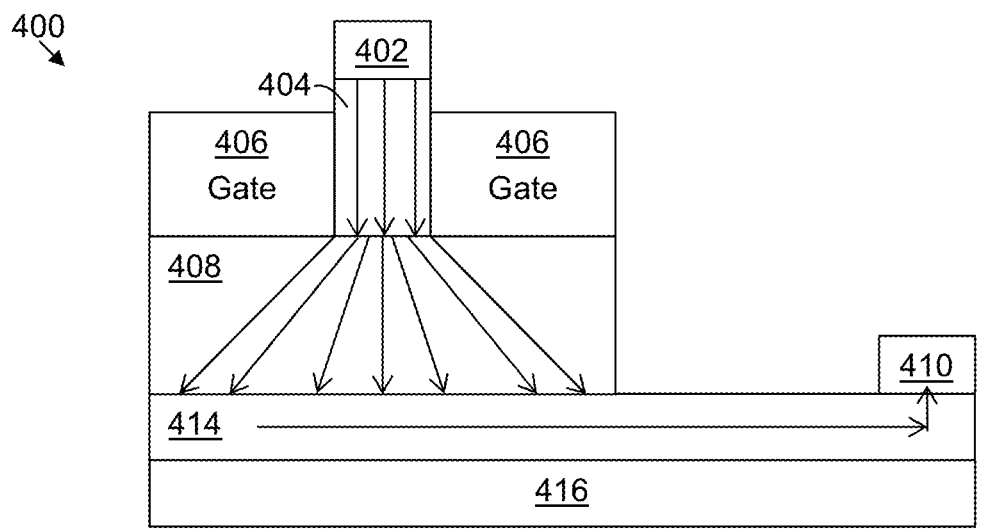
FIG. 4B illustrates electron flow in the pseudo-vertical transistor of FIG. 4A.

Another type of vertical transistor structure may have drain and source formed on the same side of the transistor, allowing the drain and source to be accessible for connections. FIG. 4A shows a cross-sectional diagram of a vertical transistor having a source 402, channel 404, gate regions 406a and 406b, and drift region 408 formed over a conductive layer 414 and substrate 416. The substrate 416 may be an insulating substrate. Drain 410 is formed over conductive layer 414 on the same side as the drift region 408 but at a position separate from drift region 408. Although source 402 and drain 410 are not positioned along a common vertical axis, source and 402 and channel 404 are positioned vertically, so this structure may be called a "semi-vertical" transistor structure. Gate regions 406a and 406b positioned around channel 404 act to control current flow through the transistor. Electrons flow from source 402 to drain 410, as shown in FIG. 4B, by passing through channel and drift region 408 in a similar manner as discussed above with reference to the fully-vertical transistor 200. Conductive layer 414 collects electrons from drift region 408 and allows electrons to flow to drain 410. Insulating substrate 416 acts to reduce current leakage from the transistor by insulating the conductive layer 414.

Some techniques of the present application relate to the relative arrangement of the channel, gate, and drift regions such that at least one gate region is around the channel and the gate and channel regions are positioned over a drift region. Such an arrangement may be formed in a vertical transistor having a fully-vertical transistor and semi-vertical transistor structures as described above. These techniques can be used to fabricate III-N semiconductor power transistors having a normally-on (depletion mode) and normally-off (enhance mode).

Any suitable materials may be used for forming the vertical transistors.

Any suitable materials may be used for the source and drain regions 202, 302, 402, 210, 310, 410 such as metal(s) and/or doped semiconductor. The source and drain regions 202, 302, 402, 210, 310, 410 may have ohmic contacts. In some embodiments, the source and/or drain regions 202, 302, 402, 210, 310, 410, include a heavily doped semiconductor material having a higher concentration of dopant than channels 204, 304, 404 and/or drift regions 208, 308, 408. These heavily doped semiconductor regions may act as a contact for a source and/or drain of a vertical transistor.

Gates 206, 306, 406 to control the transistor may be formed of any suitable conductor, such as a metal or doped semiconductor (e.g., GaN,).

Conductive layers 312 and 414 may be formed of a conductive and/or semiconductive material(s). If conductive layers 312 and 414 include a semiconductor material, the semiconductor material may have any suitable conductivity type, including but not limited to n-type, p-type or undoped type.

Channels 204, 304, 404 and drift regions 208, 308, 408 may be formed of any suitable semiconductor material(s). Channels 204, 304, 404 and drift regions 208, 308, 408 may include a compound semiconductor material, such as III-V semiconductor material (e.g., a III-N material). In some embodiments, a nitride semiconductor based transistor may be formed in which channels 204, 304, 404 and drift regions 208, 308, 408 include a nitride semiconductor material. In some embodiments, a nitride semiconductor material may be used such as $B_wAl_xIn_yGa_zN$, for example, in which w, x, y and z each have any suitable value between zero and one (inclusive), and $w+x+y+z=1$. Examples of nitride semiconductor materials include GaN, AN, AlGaN, InAlN, InAlGaN, and InGaN, by way of example and not limitation. In some embodiments, the channels 204, 304, 404 and the drift regions 208, 308, 408 may include a gallium nitride (GaN) semiconductor material. However, the techniques herein are not limited to nitride semiconductor materials being included in channels 204, 304, 404 and drift regions 208, 308, 408, as other semiconductor materials may be used.

The channels 204, 304, 404 and drift regions 208, 308, 408 may be monocrystalline, and may have any suitable orientation. Compound semiconductor materials of channels 204, 304, 404 and drift regions 208, 308, 408, may have any suitable composition at the face of the semiconductor material. If a III-N material is included, it may have an N-face composition, a group III face composition or a non-polar orientation. For example, GaN may be grown either N-face and Ga-face or in non-polar orientations.

The channels 204, 304, 404 and drift regions 208, 308, 408 may be comprised of one or more materials, depending on the type of semiconductor device to be formed. Each semiconductor region may include one layer of a single material or more than one layer of different materials. In some embodiments, the semiconductor region may include a heterostructure having a plurality of layers of different semiconductor materials. In some embodiments, the plurality of layers may be materials with different bandgaps and/or polarizations, such as nitride semiconductor materials having different compositions, e.g., $B_{w1}Al_{x1}In_{y1}Ga_{z1}N$ and $B_{w2}Al_{x2}In_{y2}Ga_{z2}N$ materials.

The reference herein to $B_wAl_xIn_yGa_zN$ or a "$B_wAl_xIn_yGa_zN$ material" refers to a semiconductor material having nitride and one or more of boron, aluminum, indium and gallium. Examples of $B_wAl_xIn_yGa_zN$ materials include GaN, AN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant (e.g., silicon, germanium, etc.). The term "gallium nitride (GaN) semiconductor material" refers to a semiconductor material that includes gallium and nitrogen and does not exclude other elements of a III-N semiconductor from being present, such as boron, aluminum, and/or indium, for example, and does not exclude the presence of dopants.

The channels 204, 304, 404 and drift regions 208, 308, 408 may be doped or undoped. If the channels 204, 304, 404 and drift regions 208, 308, 408 include a region that is doped, it may be polarization doped or may include dopants such as n-type dopants or p-type dopants, and may have any suitable doping concentration and distribution. Any suitable doping technique may be used, such as implantation or diffusion, for example. Some embodiments include vertical transistors were both the channel and the drift region are doped such that the drift region has a lower doping concentration than the channel. In some embodiments, the doping concentration of the drift region is less than $10^{16}cm^{-3}$, less than $10^{17}cm^{-3}$, or less than $10^{18}$ cm$^{-3}$.

Some embodiments relate to a vertical transistor with multiple semiconductor regions having varying concentrations of doping. These semiconductor regions may form components of the transistor including the source, channel, drift region, and/or drain. Source and/or drain regions may be heavily doped to form a suitable source and/or drain contacts for the transistor. One or more semiconductor regions between the source and drain may include varying concentration of dopant to have a higher concentration of dopant closer to the source than to the drain. In some embodiments, two semiconductor regions may form between the source and drain where the gate is around one of the semiconductor regions having a higher dopant concentration than the other semiconductor region, which may or may not be doped. In this manner, there may be four semiconductor regions distinguished by varying concentration of dopant. These four semiconductor regions may include a heavily doped source region, a channel region around which a gate is formed having a lower concentration of dopant than the source region, a drift region between the drain and the channel region having no dopant or a lower concentration of dopant than the channel region, and a heavily doped drain region. In some embodiments, a conductive layer is positioned between the drain and the drift region.

Figure 5:
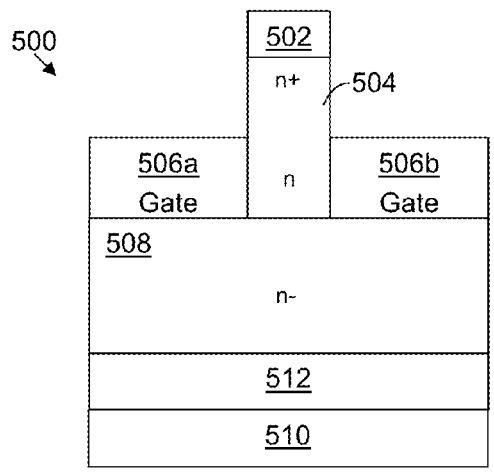
FIG. 5 shows an exemplary vertical transistor having distributed dopant concentration through the channel and drift region.

Some embodiments include dopant distributed within a channel such that there is a higher concentration of dopant closer to the source than to the drift region. FIG. 5 shows a cross-sectional view of a vertical transistor 500 having a channel 504 and drift region 508 with distributed dopant concentration such that there is a high level of dopant (e.g., n-type dopant), indicated by n+, within channel 504 closer to source 502 and a low level of dopant, indicated by n-, within the drift region 508 closer to the conductive layer 512 and drain 510. Channel 504 and drift region 508 may be formed from the same type of semiconductor material (e.g., GaN). Gate regions 506 may be formed of metal, creating a Schottky gate junction by directly contacting channel 504.

Some embodiments relate to one or more additional layers formed between a gate region and a channel and/or a gate region and a drift region. In some embodiments, a dielectric layer may be formed between a gate region and a channel. The dielectric layer may be formed of any suitable dielectric or insulating material, such as $Al_2O_3$, $SiO_2$, $HfO_2$, $Si_xO_yN_z$, $Si_xH_wO_yN_z$, or $Si_xN_y$, for example. The dielectric region may include more than one dielectric material. In some embodiments, the dielectric region may include a single dielectric layer or a plurality of sub-layers.

Figure 6A:
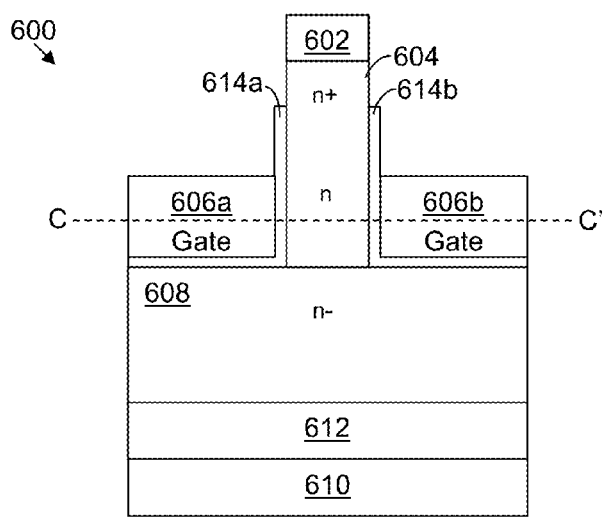
FIG. 6A. shows an exemplary vertical transistor having a dielectric region between the gate and channel.
Figure 6B:
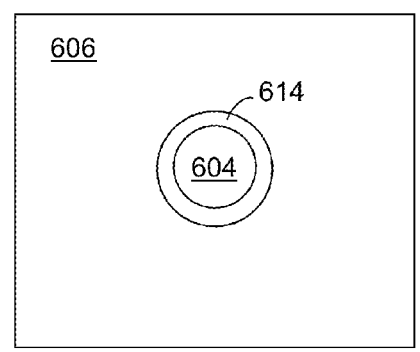
FIG. 6B shows a planar view of the vertical transistor of FIG. 6A along line C-C'.

FIG. 6A shows a cross-sectional view of a vertical transistor 600 having dielectric regions 614a, 614b between gate regions 606a, 606b and channel 604. FIG. 6B illustrates a planar view of vertical transistor 600 along line C to C' where both the dielectric region 614 and gate completely surround the channel 604 with the dielectric 614 formed between channel 604 and gate 606. Although a circular cross-sectional area for the channel is shown in FIG. 6B, channels and surrounding dielectric layer and gate may have other geometries, such as an elliptical cross-sectional area as shown with respect to FIG. 2C. In some embodiments, both channel 604 and drift region 608 are regions of III-nitride semiconductor material doped with n-type dopant such that the distribution of dopant is higher closer to source 602 than drain 610. In this manner, dielectric 614 separates the gate from the channel 604 and may reduce gate to drain leakage current. In embodiments where gate 606 is formed of metal and the channel is a semiconductor, the structure shown in FIG. 6A is a vertical equivalent of a metal-insulation-semiconductor field effect transistor (MISFET).

Figure 6C:
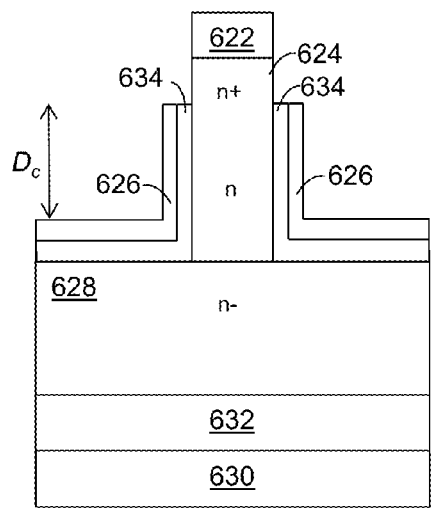
FIG. 6C shows an exemplary vertical transistor having a dielectric region between the gate and channel.

FIG. 6C illustrates an exemplary vertical transistor having gate 626 as a layer of material over channel 324 and drift region 328 with an additional layer of material, such as a dielectric or oxide, between metal layer 626 and channel 624. The gate layer 626 may completely surround the channel 324 and have a vertical dimension, $D_c$, suitable to control the electron flow through channel 624. In some embodiments, the vertical dimension may be less than 500 nm, less than 400 nm, less than 300 nm, or less 200 nm.

Figure 7:
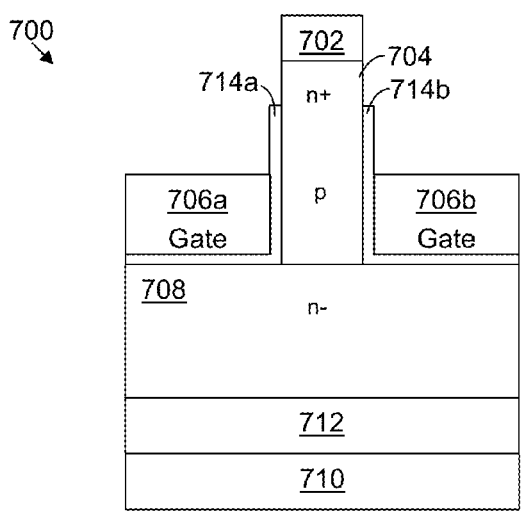
FIG. 7 shows an exemplary vertical transistor having an oxide region between the gate and channel.

In some embodiments, a vertical transistor includes one or more regions of oxide formed between gate regions and the channel of the vertical transistor. These embodiments may relate to a vertical equivalent of a metal-oxide-semiconductor field effect transistor (MOSFET) for vertical transistor structures having a metal gate and semiconductor channel. The FIG. 7 illustrates a cross-sectional view of an exemplary vertical transistor where the channel 704 is a III-N semiconductor material (e.g., GaN) and the one or more regions of oxide 714a, 714b may be positioned between the gate regions 706a, 706b and channel 704. The channel may include different types of dopant, and in some embodiments, may have a region proximate to the source 702 with a different type of dopant than a region surrounded by the gate regions 706a, 706b. Drift region 708 may have a type of dopant similar to the region of the channel proximate the source. In some embodiments, drift region 708 may contain a lower contraction of the dopant than in the channel 704. As illustrated in FIG. 7, a region of channel 704 has a n-type dopant region in proximity to the source 702 and a p-type dopant region below the n-type dopant region, which is surrounded by gate regions 706a, 706b. Drift region may also contain a III-N semiconductor material that includes n-dopant at a lower concentration than the n-type dopant region of the channel. Other configurations and distribution of dopant and types of dopant may be formed in the channel and/or drift regions.

Figure 8:
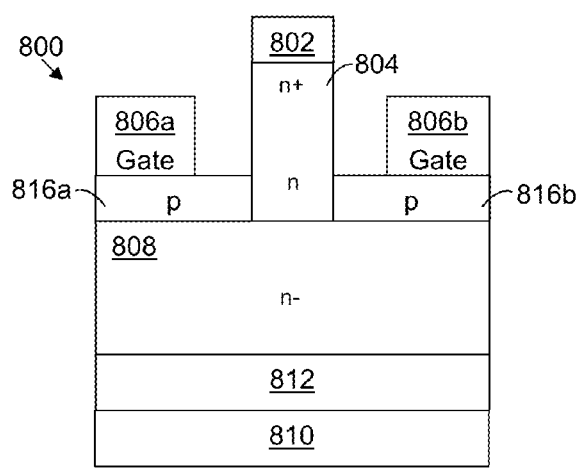
FIG. 8 shows an exemplary vertical transistor having a p-n junction near the gate.

Normally off operation for a vertical transistor having one or more gate regions surrounding a channel according to the techniques described herein can be achieved by introducing a p-n junction. The p-n junction alters the depletion region of the channel and closes the channel such that it operates as a normally off transistor. The presence of the p-n junction in the vertical transistor may reduce leakage of current from gate to drain. An exemplary structure of a vertical transistor 800 having a p-n junction is shown in FIG. 8. P-type doped semiconductor regions (e.g., p-GaN) 816a, 816b are formed between gate regions 806a, 806b and drift region 808 and/or and contact channel 804 to form p-n junctions. Gate regions 806a, 806b are formed separate from channel 804 and drift region 808 and may include ohmic contacts with the p-type semiconductor. These types of structures having a p-n junction near the gate may correspond to a vertical equivalent of a junction gate field-effect transistor (JFET).

Figure 9:
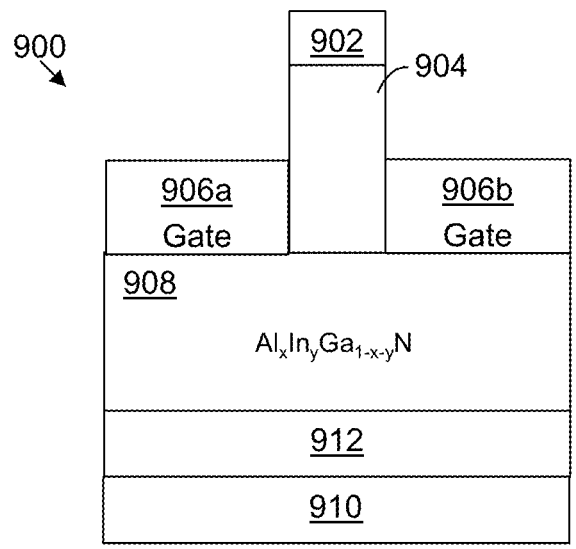
FIG. 9 shows an exemplary vertical transistor having a p-type doped material as the gate.

FIG. 9 illustrates another type of embodiment that includes a p-type of semiconductor material, not necessarily a nitride semiconductor, as the gate regions 906a, 906b. Channel 904 and drift region 908 may include nitride semiconductor represented by $Al_xIn_yGa_{1-x-y}N$, where x<1, y<1, and x+y<1), which may have a higher critical electric field than GaN. Source 902 is formed over channel 904, and drift region 908 is formed over conductive layer 912 and drain 910.

The above described structures may be fabricated on N-face and Ga-face III-N semiconducting wafers. Alternatively, structures may be formed on foreign wafers by layer transfer techniques and/or by forming a semi-vertical transistor structure as described above with reference to FIGS. 4A and 4B. It should be appreciated that although fully-vertical transistor structures are depicted in FIGS. 5-9, semi-vertical structures similar to transistor 400 shown in FIGS. 4A and 4B can include similar arrangements of channel, gate regions, source, and drift regions as those described with reference to transistors 500, 600, 700, 800, and 900.

Additional structural components may be included in a vertical transistor structure to control and shape the electric field within the device. Such techniques may include special junction termination techniques such as field plates, guard rings, bevel edge termination, and junction termination extension. Controlling and shaping the electric field within a vertical transistor may allow a higher breakdown voltage for the vertical transistor. In the vertical transistor structures described above, the region of highest electric field occurs at the intersection of the gate region, channel, and drift region. Aspects of the present application are directed to techniques and structures that reduce the magnitude of the electric field at the intersection of the gate region, channel, and drift region in order to control and shape the electric field. By reducing the peak electric field with an edge termination structure designed to alter the shape of the electric field, reliability of the vertical transistor may be improved.

Figure 10:
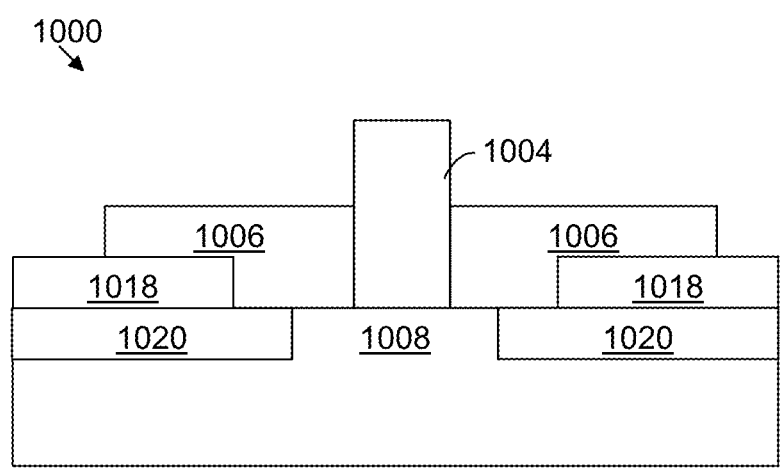
FIG. 10 shows a vertical transistor having an exemplary edge termination structure.

An exemplary edge termination structure for a vertical transistor having a channel 1008 surrounded by gate regions 1006 is shown in FIG. 10 and includes a field plate 1018 combined with a mesa termination 1020. This edge termination structure may act to reduce the magnitude of the electric field at the intersection of the channel 1004, gate 1006, and drift region 1008. The mesa isolation 1020 can be achieved with any suitable method, including etching a portion of the drift region 1008 and filling with dielectric material and/or ion implantation. The field plate 1018 may be formed of a dielectric region between the mesa isolation 1020 and the gate region.

Additional Aspects

The techniques described herein may be applied to any type of field effect transistor. In some embodiments, the techniques described herein may be applied to power transistors. Such techniques can provide improvements in power transistors that will enable significant improvements in power electronics systems for hybrid vehicles, high efficiency power inverters for solar cells, and power converters for LEDs, for example, as well as high-speed digital electronics.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A vertical semiconductor transistor comprising:
   at least one semiconductor region including a first semiconductor region and a second semiconductor region having the same type of doping, wherein the at least one semiconductor region includes a III-nitride semiconductor material and the first semiconductor region is adjacent to the second semiconductor region, and wherein the first semiconductor region has a higher dopant concentration than the second semiconductor region;
   a source formed over the at least one semiconductor region;
   at least one gate region formed around at least a portion of the first semiconductor region, wherein the at least one gate region includes a metal; and
   a dielectric layer between the at least one semiconductor region and the at least one gate region.

2. The vertical semiconductor transistor of claim 1, wherein the at least one gate region is formed around the first semiconductor region to enclose a cross-sectional area of the first semiconductor region.

3. The vertical semiconductor transistor of claim 2, wherein the at least one gate region and the first semiconductor region are coaxial.

4. The vertical semiconductor transistor of claim 1, wherein the first semiconductor region is formed over the second semiconductor region, wherein the source is formed over the first semiconductor region, the second semiconductor region has a larger cross-sectional area than the first semiconductor region, and the at least one gate region is formed around the first semiconductor region.

5. The vertical semiconductor transistor of claim 4, wherein the at least one semiconductor region further comprises a third semiconductor region having a higher dopant concentration than the first semiconductor region, wherein the third semiconductor region is formed between the first semiconductor region and the source.

6. The vertical semiconductor transistor of claim 1, further comprising a conductive layer formed on a surface of the at least one semiconductor region opposite to the source.

7. The vertical semiconductor transistor of claim 6, wherein the at least one semiconductor region has a higher concentration of dopant proximate to the source than to the conductive layer.

8. The vertical semiconductor transistor of claim 6, further comprising a drain formed on a surface of the conductive layer opposite to the at least one semiconductor region.

9. The vertical semiconductor transistor of claim 6, further comprising a drain formed on a surface of the conductive layer that contacts the at least one semiconductor region, wherein the drain is positioned separate from the at least one semiconductor region.

10. The vertical semiconductor transistor of claim 6, further comprising a drain formed on a surface of the conductive layer, wherein the drain includes a semiconductor region with a higher dopant concentration than the at least one semiconductor region.

11. The vertical semiconductor transistor of claim 1, wherein the source includes a semiconductor region having a higher dopant concentration than the at least one semiconductor region.

12. A vertical semiconductor transistor comprising:
at least one semiconductor region including a first region and a second region, wherein the at least one semiconductor region includes a III-nitride semiconductor material, and wherein the first region and the second region have different types of doping;
a source formed over the first region;
at least one gate region formed around at least a portion of only the second region, wherein the at least one gate region includes a metal; and
an oxide layer between the at least one semiconductor region and the at least one gate region.

13. The vertical semiconductor transistor of claim 12, wherein the at least one gate region is formed around the second region to enclose a cross-sectional area of the second region.

14. The vertical semiconductor transistor of claim 12, further comprising a conductive layer formed on a surface of the at least one semiconductor region opposite to the source.

15. The vertical semiconductor transistor of claim 14, further comprising a drain formed on a surface of the conductive layer opposite to the at least one semiconductor region.

16. The vertical semiconductor transistor of claim 12, wherein the second region has a cross-sectional area surrounded by the at least one gate region.

17. The vertical semiconductor transistor of claim 12, wherein the first region is a first n-type doped region proximate to the source, the at least one semiconductor region further includes a second n-type doped region proximate to a conductive layer, and the second region is a p-type doped region between the first n-type doped region and the second n-type doped region.

18. The vertical semiconductor transistor of claim 17, wherein the first n-type doped region has a higher dopant concentration than the second n-type doped region.

19. A method of forming a vertical semiconductor transistor, the method comprising:
forming at least one semiconductor region including a first semiconductor region and a second semiconductor region having the same type of doping, wherein the at least one semiconductor region includes a III-nitride semiconductor material and the first semiconductor region is adjacent to the second semiconductor region, and wherein the first semiconductor region has a higher dopant concentration than the second semiconductor region;
forming a source over the at least one semiconductor region;
forming at least one gate region around at least a portion of the first semiconductor region, wherein the at least one gate region includes a metal; and
forming a dielectric layer between the at least one semiconductor region and the at least one gate region.

20. The method of claim 19, wherein forming the at least one semiconductor region comprises forming the first semiconductor region over the second semiconductor region, wherein the source is formed over the first semiconductor region, and the second semiconductor region has a larger cross-sectional area than the first semiconductor region.

21. The method of claim 20, wherein forming the first semiconductor region over the second semiconductor region comprises forming the first semiconductor region with a higher dopant concentration than the second semiconductor region.

22. A method of forming a vertical semiconductor transistor, the method comprising:
forming at least one semiconductor region including a first region and a second region, wherein the at least one semiconductor region includes a III-nitride semiconductor material, and wherein the first region and the second region have different types of doping;
forming a source over the first region;
forming at least one gate region around at least a portion of only the second region, wherein the at least one gate region includes a metal; and
forming an oxide layer between the at least one semiconductor region and the at least one gate region.

23. The method of claim 22, wherein forming the at least one semiconductor region comprises forming a first n-type doped region proximate to the source as the first region, a second n-type doped region proximate to a conductive layer, and a p-type doped region between the first n-type doped region and the second n-type doped region as the second region.

* * * * *